United States Patent
Singer et al.

(10) Patent No.: US 11,177,668 B2
(45) Date of Patent: Nov. 16, 2021

(54) MANAGING TOP-OFF CHARGING AND DISCHARGE TESTING OF BATTERY PACKS TO OPTIMIZE CAPACITY

(71) Applicant: INTERNATIONAL BUSINESS MACHINES CORPORATION, Armonk, NY (US)

(72) Inventors: Noah Singer, White Plains, NY (US); Steven John Ahladas, Highland, NY (US); Robert K. Mullady, Highland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 119 days.

(21) Appl. No.: 16/807,443

(22) Filed: Mar. 3, 2020

(65) Prior Publication Data
US 2021/0281081 A1  Sep. 9, 2021

(51) Int. Cl.
*H02J 7/00* (2006.01)
*G01R 31/367* (2019.01)
(Continued)

(52) U.S. Cl.
CPC .......... *H02J 7/0013* (2013.01); *G01R 31/367* (2019.01); *G01R 31/382* (2019.01); *G01R 31/396* (2019.01); *H02J 7/0047* (2013.01)

(58) Field of Classification Search
CPC .......... H02J 7/0013; H02J 7/0047; H02J 7/00; G01R 31/367; G01R 31/396; G01R 31/382
See application file for complete search history.

(56) References Cited

U.S. PATENT DOCUMENTS

| 7,573,236 B2 | 8/2009 | Sugimoto |
| 9,231,434 B2 | 1/2016 | Das et al. |

(Continued)

FOREIGN PATENT DOCUMENTS

| CN | 104488163 A | 4/2015 |
| CN | 109245235 A | 1/2019 |
| CN | 209016762 U | 6/2019 |

OTHER PUBLICATIONS

Mel et al., "The NIST Definition of Cloud Computing," National Institute of Standards and Technology, Information Technology Laboratory, Special Publication 800-145, Sep. 2011 (pp. 1-7).

*Primary Examiner* — Vuthe Siek
(74) *Attorney, Agent, or Firm* — Thon Poltavets, Esq.; Kevin P. Radigan, Esq.; Heslin Rothenberg Farley & Mesiti P.C.

(57) ABSTRACT

Computer-implemented managing of battery capacity within a battery system is provided. The managing includes obtaining, by one or more processors, data representative of a number (N) of battery packs in the battery system, and ascertaining, by the processor(s), a battery pack self-discharge time interval ($T_D$) from full-charge to a partially discharged threshold for initiating top-off charging. The managing also includes determining, by the processor(s), a charge-staggering time interval ($T_S$) using the number (N) of battery packs in the battery system and the ascertained battery pack self-discharge time interval ($T_D$), and staggering, by the processor(s), top-off charging of the battery packs of the N battery packs in the battery system using, at least in part, the charge-staggering time interval ($T_S$).

20 Claims, 13 Drawing Sheets

(51) Int. Cl.
    *G01R 31/396*     (2019.01)
    *G01R 31/382*     (2019.01)

(56) References Cited

U.S. PATENT DOCUMENTS

| | | | | |
|---|---|---|---|---|
| 2008/0231237 | A1* | 9/2008 | Kishi | H02J 7/0071 320/160 |
| 2009/0093987 | A1* | 4/2009 | Ni | G01R 35/00 702/107 |
| 2011/0121790 | A1* | 5/2011 | Brandon, II | H01M 10/44 320/160 |
| 2011/0260687 | A1* | 10/2011 | Kudo | H01M 10/425 320/118 |
| 2012/0063255 | A1* | 3/2012 | Nakazumi | G06F 11/1441 365/228 |
| 2014/0285152 | A1* | 9/2014 | Becker | H02J 7/0014 320/118 |
| 2015/0056479 | A1 | 2/2015 | Poehler et al. | |
| 2015/0069975 | A1 | 3/2015 | Farah et al. | |

\* cited by examiner

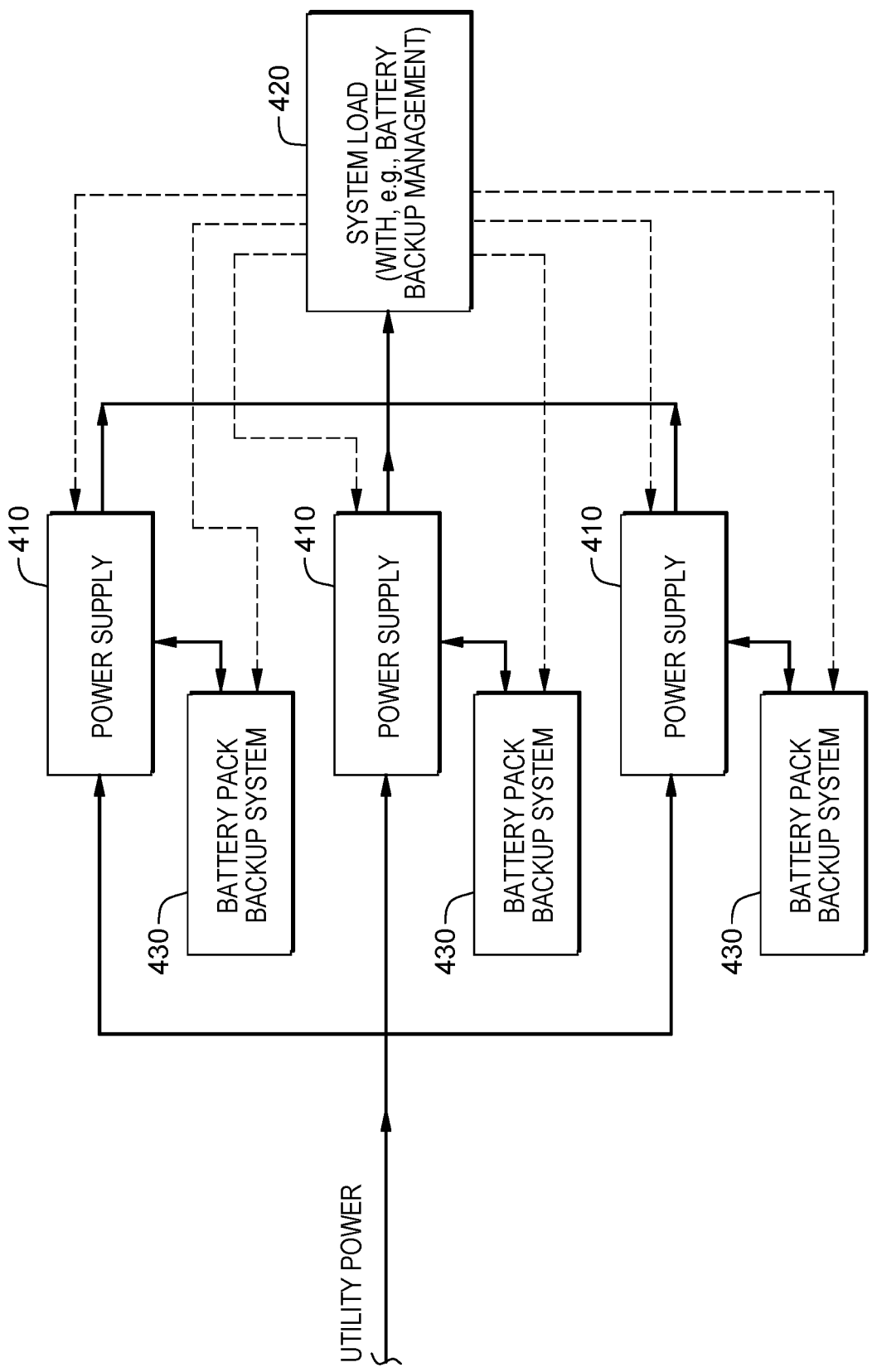

MANAGING TOP-OFF CHARGING AND DISCHARGE TESTING OF BATTERY PACKS TO OPTIMIZE CAPACITY

BACKGROUND

Lithium-ion batteries are one type of battery of a wide variety of batteries available for use as an energy source, including as a backup energy source. Lithium-ion batteries are rechargeable batteries in which lithium-ions move from a negative electrode to a positive electrode during discharge and back when charging. An intercalated lithium compound is used in a lithium-ion battery as one electrode material. The electrolyte, which allows for ionic movement, and the two electrodes are the constituent components of a lithium-ion battery cell. A cell is a basic electrochemical unit that contains the electrodes, separator and electrolyte. A battery or battery pack is a collection of cells or cell assemblies. These may be ready for use by providing an appropriate housing, and electrical interconnections.

Battery packs, such as lithium-ion battery packs, contain cells which self-discharge over time, and require top-off charging to maintain battery capacity. Additionally, battery packs often require discharge testing to maintain the health of the battery cells, and to verify capacity of the battery pack(s).

SUMMARY

Certain shortcomings of the prior art are overcome and additional advantages are provided through the provision of a computer-implemented method of managing battery capacity within a battery system. The computer-implemented method includes obtaining, by one or more processors, data representative of a number (N) of battery packs in the battery system, and ascertaining, by the one or more processors, a battery pack self-discharge time interval ($T_D$) from full-charge to a partially discharged threshold for initiating top-off charging. The computer-implemented method also includes determining, by the one or more processors, a charge-staggering time interval ($T_S$), where the determining uses the number (N) of battery packs in the battery system and the ascertained battery pack self-discharge time interval ($T_D$), and staggering, by the one or more processors, top-off charging of the battery packs of the N battery packs in the battery system using, at least in part, the charge-staggering time interval ($T_S$).

Systems and computer program products relating to one or more aspects are also described and claimed herein. Further, services relating to one or more aspects are also described and can be claimed herein.

Additional features and advantages are realized through the techniques described herein. Other embodiments and aspects of the invention are described in detail herein and are considered a part of the claimed aspects.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 4B depicts another embodiment of a power supply system with multiple power supplies supplying a system load, and showing multiple battery pack backup systems managed for battery capacity optimization, in accordance with one or more aspects of the present invention;

DETAILED DESCRIPTION

Figure 1:
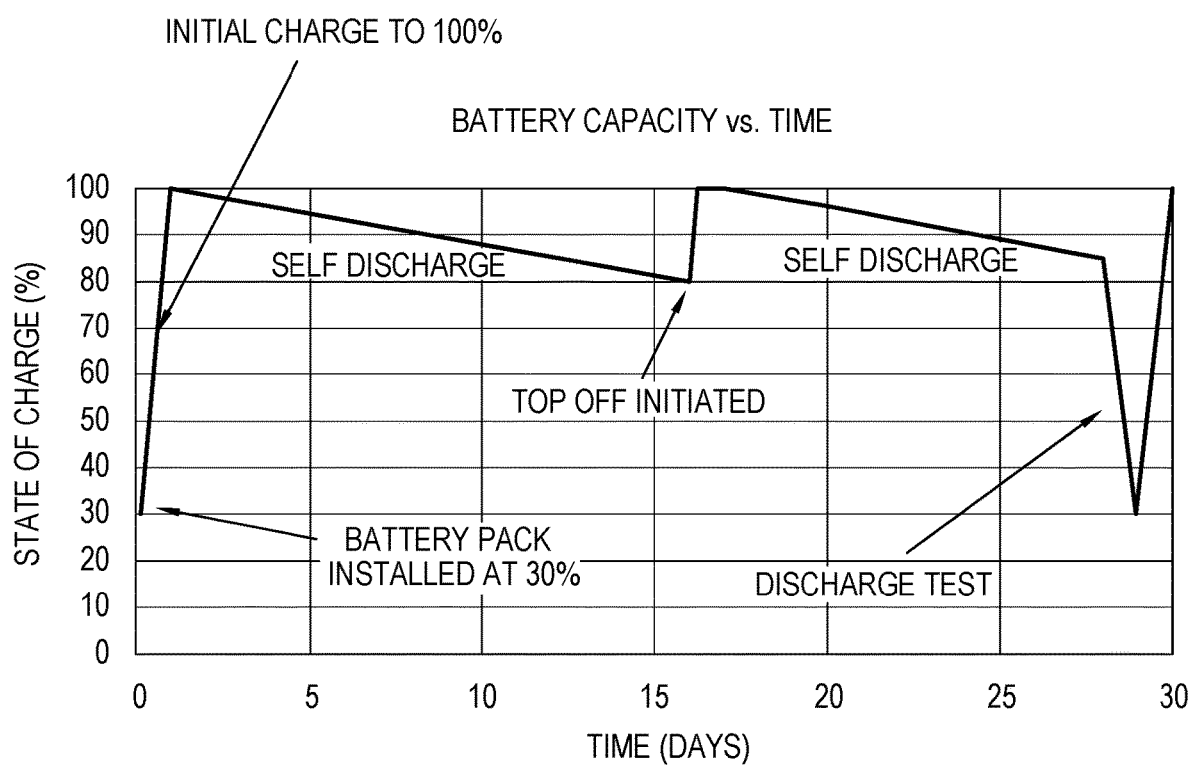
FIG. 1 graphically illustrates one embodiment of battery capacity over time of a rechargeable battery pack of a battery system.

The accompanying figures, in which like reference numerals refer to identical or functionally similar elements throughout the separate views, and which are incorporated in and form a part of the specification, further illustrate the present invention and, together with the detailed description, serve to explain aspects of the present invention. Note in this regard that descriptions of well-known systems, devices, processing techniques, etc., are omitted so as not to obscure the invention in detail. It should be understood, however, that the detailed description and this specific example(s), while indicating aspects of the invention, are given by way of illustration only, and not limitation. Various substitutions, modifications, additions, and/or other arrangements, within the spirit or scope of the underlying inventive concepts will be apparent to those skilled in the art from this disclosure. Note further that numerous inventive aspects and features are disclosed herein, and unless inconsistent, each disclosed aspect or feature is combinable with any other disclosed aspect or feature as desired for a particular application of one or more of the concepts disclosed herein.

Note also that illustrative embodiments are described below using specific code, designs, architectures, protocols, layouts, schematics, or tools only as examples, and not by way of limitation. Furthermore, the illustrative embodiments are described in certain instances using particular software, tools, or data processing environments only as example for clarity of description. The illustrative embodiments can be used in conjunction with other comparable or similarly purposed structures, systems, applications, or architectures. One or more aspects of an illustrative embodiment can be implemented in hardware, software, or a combination thereof.

Figure 7:
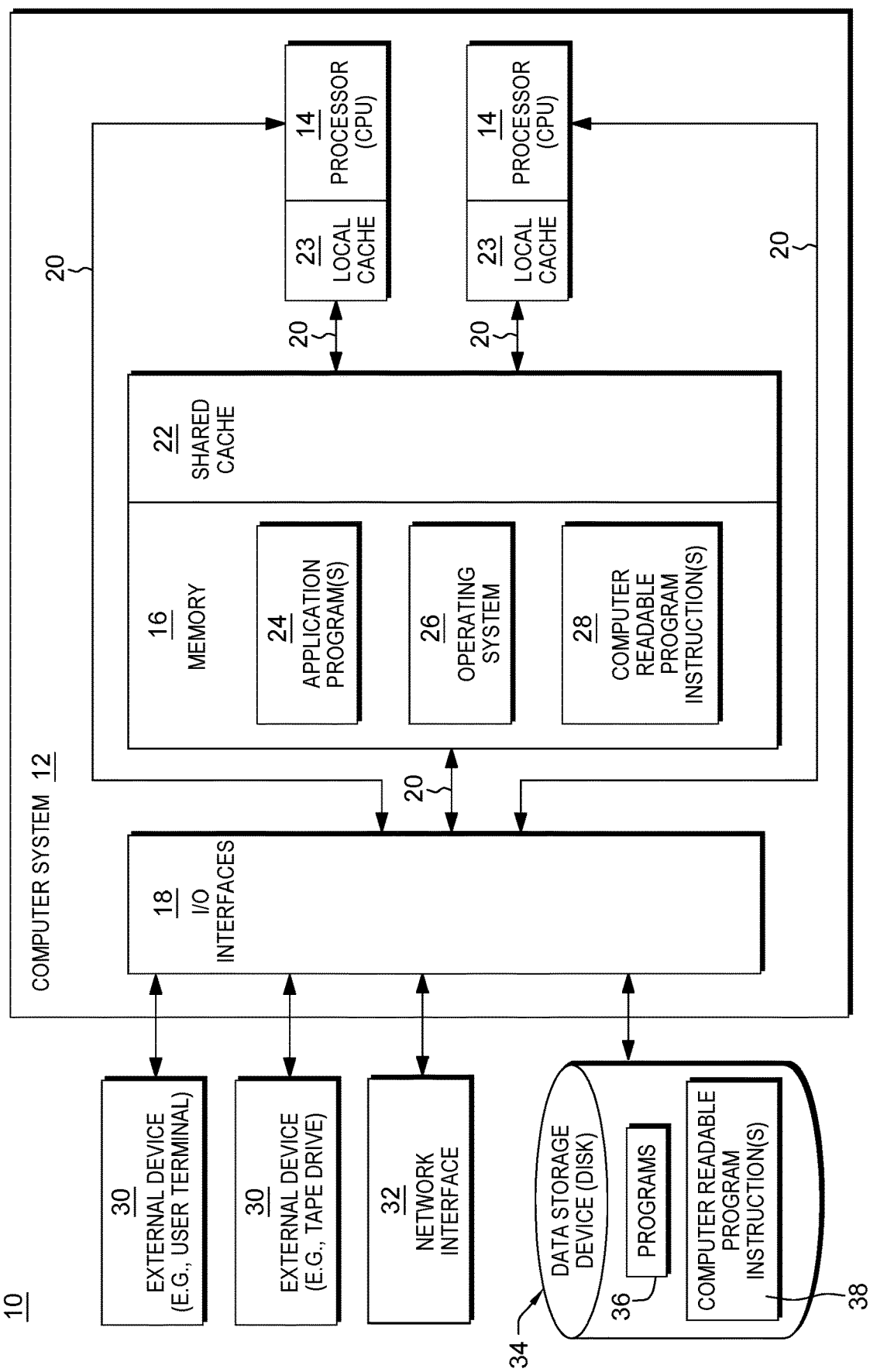
FIG. 7 depicts one embodiment of a computing system to implement, or facilitate implementing, one or more aspects of managing battery capacity, in accordance with one or more aspects of the present invention.

As understood by one skilled in the art, program code, as referred to in this application, can include both software and hardware. For example, program code in certain embodiments of the present invention can include fixed function hardware, but other embodiments can utilize a software-based implementation of the functionality described. Certain embodiments combine both types of program code. One example of program code, also referred to as one or more programs or program instructions, is depicted in FIG. 7 as application program(s) 24 and/or computer-readable program instruction(s) 28, stored in memory 16 of computer system 12, as well as programs 36 and computer-readable program instruction(s) 38 stored in a data storage device 34 accessed by computer system 12.

As noted initially, lithium-ion batteries are one type of rechargeable battery of a wide variety of batteries available for use as an energy source, including as a backup energy source. Depending on the application, a battery system can include multiple battery packs, such as multiple lithium-ion battery packs, shipped at a relatively low state-of-charge. For instance, for lithium-ion battery packs of a backup battery system configured to provide standby power to one or more computing components of a computing or information technology (IT) rack, the battery packs can be shipped at approximately 30% state-of-charge. Upon arrival and the data center or end-user installation, the battery packs are then charged to 100% state-of-charge, i.e., full capacity. An example of this charging from 30% to 100% is illustrated in the battery capacity versus time graph of FIG. 1 for a single battery pack.

Lithium-ion battery packs contain lithium-ion cells which self-discharge over time, and require top-off charging, as illustrated in FIG. 1. For instance, lithium-ion battery packs configured as a backup battery system to provide standby power to one or more computing components of a computing or information technology (IT) rack for a specified period of time, might have a top-off charging interval of about every two weeks or so. Further, lithium-ion battery packs require discharge testing to maintain the health of the battery cells, and to verify the capacity of the battery pack. This discharge testing might occur, for instance, every month or so, as illustrated in the battery capacity graph of FIG. 1.

Figure 2:
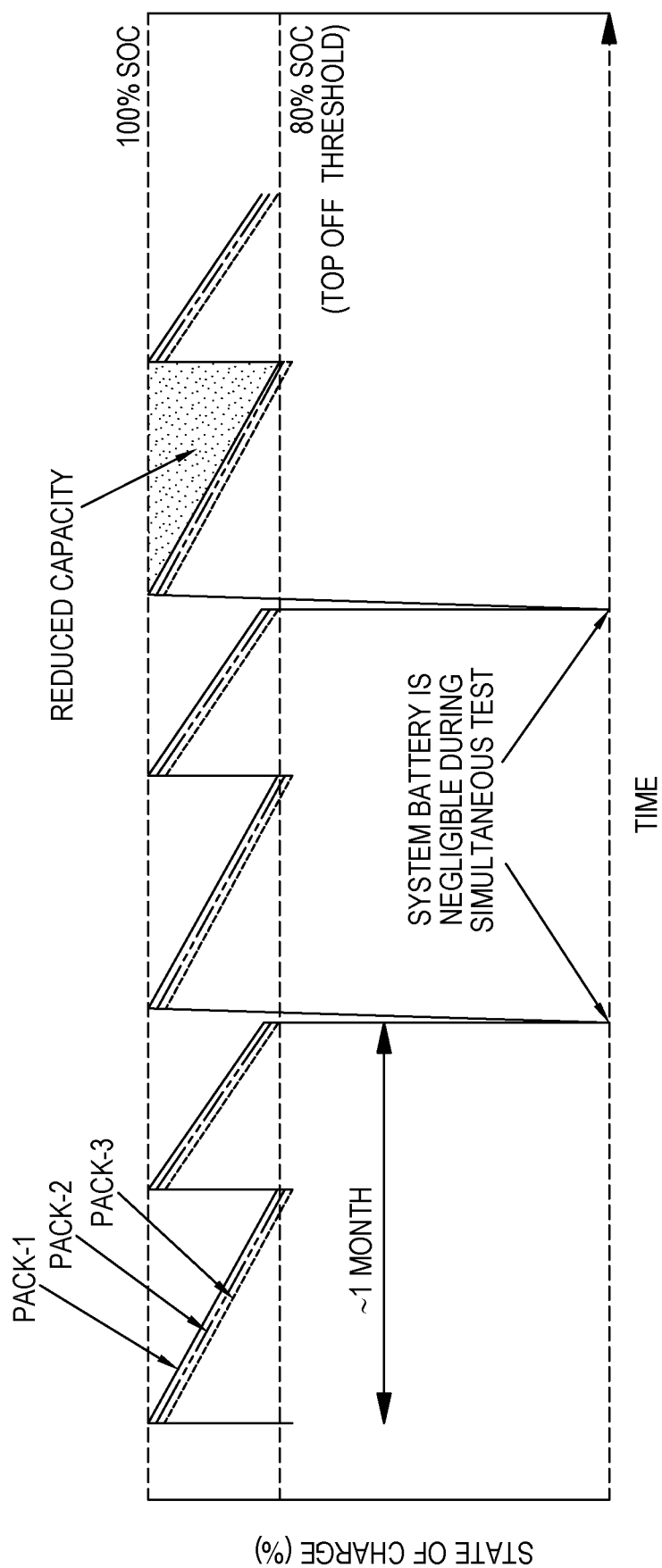
FIG. 2 graphically depicts one embodiment of battery capacity over time of multiple rechargeable battery packs of a battery system.

As depicted in FIG. 2, in an application where the battery system includes multiple identical battery packs, the resultant discharge tests can occur nearly simultaneously due to similar battery pack install dates and performance characteristics. In particular, the performance of each battery pack in the battery system can be similar, since the battery packs will oftentimes share the same cell lot, and date codes. This can result in situations where there is reduced, and sometimes minimal, battery capacity available (as illustrated in FIG. 2) to back-up a system load for the desired period of time, that is, should loss of main power occur. For instance, due to the inherent self-discharging of lithium-ion battery packs, and their common install date and performance characteristics, there can be repeating time periods when there is significantly reduced capacity available across the multiple battery packs of the battery system.

Addressing this issue, embodiments of the present invention include a computer-implemented method, system, and a computer program product, where program code executing on one or more processors obtains data representative of a number (N) of battery packs in a battery system, such as, for instance, a backup battery system configured to provide standby power to one or more computing components of a computing or information technology (IT) rack. Embodiments of the present invention further include program code that ascertains a battery pack self-discharge time interval ($T_D$) from full-charge to a partially discharged threshold for initiating top-off charging. By way of example, the partially discharged threshold can be a predefined threshold set for the particular battery system application. In the case of a backup battery system configured to provide standby power to one or more computing components of a computing or information technology (IT) rack, the partially discharged threshold can be, for instance, 80% of a full state-of-charge of the respective battery pack. Embodiments of the present invention also include program code that determines a charge-staggering time interval ($T_S$) using the number (N) of battery packs in the battery system and the ascertained battery pack self-discharge time interval ($T_D$). Embodiments of the present invention further include program code that staggers top-off charging of the battery packs of the N battery packs in the battery system using, at least in part, the charge-staggering time interval ($T_S$).

In certain embodiments of the present invention, the battery pack self-discharge time interval ($T_D$) is a composite self-discharge time interval for the battery packs of the N battery packs in the battery system.

In one or more embodiments, ascertaining the battery pack self-discharge time interval ($T_D$) from full-charge to the partially discharged threshold includes program code executing on one or more processors to: ascertain a self-discharge duration for each battery pack of the N battery packs of the battery system from full-charge to the partially discharged threshold for initiating top-off charging; determine, for each battery pack of the N battery packs, whether the self-discharge duration of the battery pack is within a similarity threshold of the self-discharge durations of other battery packs of the N battery packs; and based on determining that the self-discharge durations for the N battery packs are within the similarity threshold, average the self-discharge durations of the N battery packs together to obtain the composite self-discharge time interval for the N battery packs in the battery system.

In certain embodiments of the present invention, based on determining, by program code executing on the one or more processors, that a self-discharge duration of a battery pack of the N battery packs is outside the similarity threshold from the self-discharge durations of other battery packs of the N battery packs, the program code executing on the one or more processors averages only the self-discharge durations within the similarity threshold together to obtain the composite self-discharge time interval. Further, in one or more embodiments, the program code executing on the one or more processors sends a signal indicative of an issue with the battery pack having the self-discharge duration outside the similarity threshold from the self-discharge durations of other battery packs of the N battery packs. In one or more implementations, the similarity threshold can be, for instance, 10% or less, such as, for instance, 5% or less.

In certain embodiments, program code executing on the one or more processors determines the charge-staggering time interval ($T_S$) by dividing data representative of the composite self-discharge time interval ($T_D$) by the number N to obtain the charge-staggering time interval ($T_S$).

Further, in one or more embodiments, program code executing on the one or more processors staggers the top-off charging of the N battery packs by determining whether a current operational time of the battery system is an integer multiple of the charge-staggering time interval ($T_S$), and based on the current operational time being an integer multiple of the charge-staggering time interval ($T_S$), proceeding with top-off charging of a next battery pack of the N battery packs in the battery system.

In one or more embodiments of the present invention, program code executing on the one or more processors further staggers discharge testing of the N battery packs so that only one battery pack of the N battery packs undergoes discharge for testing at a time. In certain embodiments of the present invention, program code executing on one or more processors staggers discharge testing by: determining whether a battery pack of the N battery packs has reached the partially discharged threshold for initiating top-off charging; determining whether the battery pack has exceeded a minimum required time interval between discharge testing; and based on the battery pack having reached the particularly discharged threshold, and based on the battery pack being at or exceeding the minimum required time interval between discharge testing, proceeding with discharge testing of the battery pack.

In certain embodiments of the present invention, program code executing on one or more processors staggers top-off charging by spacing equidistant in time top-off charging of battery packs of the N battery packs in the battery system.

Embodiments of the present invention are inextricably tied to computing, and provide significantly more than existing approaches to battery capacity management. For instance, embodiments of the present invention provide program code executing on one or more processors to exploit the interconnectivity of various systems, as well as to utilize various computing-centric data analysis and handling techniques, in order to obtain data representative of a number (N) of battery packs in the battery system, ascertain a battery self-discharge time interval ($T_D$) from full-charge to a partially discharged threshold for initiating top-off charging, determine a charge-staggering time interval ($T_S$) using the number (N) of battery packs in the battery system and the ascertained battery pack self-discharge time interval ($T_D$), and stagger top-off charging of the battery packs in the battery system using, at least in part, the charge-staggering time interval ($T_S$). Both the interconnectivity of the computing systems utilized and the computer-exclusive data processing techniques utilized by the program code enable various aspects of the present invention. Further, embodiments of the present invention provide significantly more functionality than existing approaches to battery capacity management by selectively staggering top-off charging and discharge testing of battery packs within a battery system to optimize battery system capacity in operation. Advantageously, embodiments of the present invention prevent a situation where there is insufficient capacity available to support a system load, and embodiments of the present invention optimize battery capacity management to provide a more homogenous, total system battery capacity.

Figure 3:
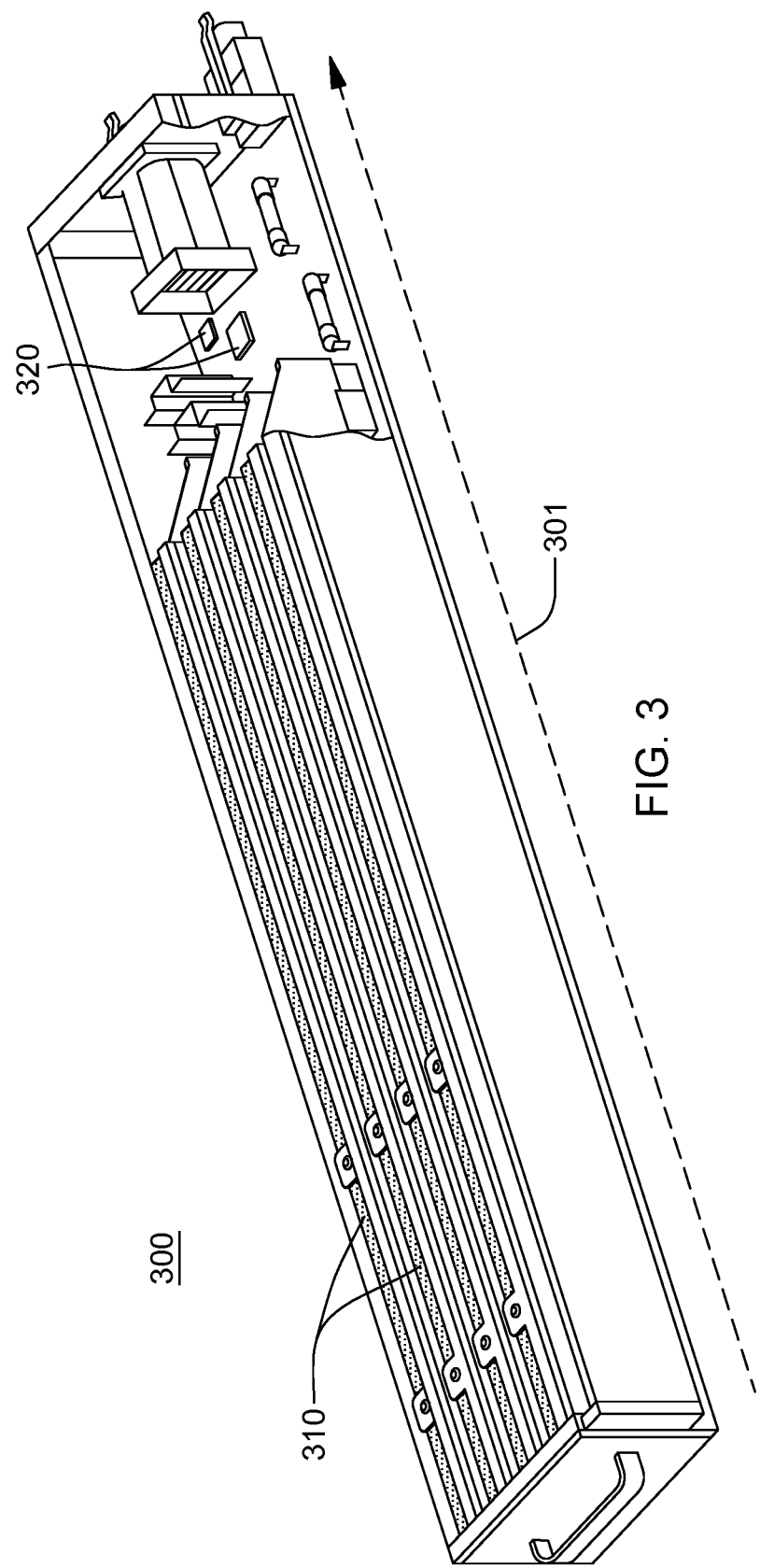
FIG. 3 depicts one embodiment of a battery pack, or battery, to have battery capacity managed, in accordance with one or more aspects of the present invention.

By way of example, FIG. 3 depicts one embodiment of a battery pack 300, or battery pack system, including multiple battery cells 310 and associated components 320 configured as, for instance, a battery pack backup to provide standby power to one or more computing components of a computing or information technology (IT) rack, for instance, for at least a specified period of time upon loss of main power. Depending on the implementation, a computing rack can include a number of battery pack backup systems, such as battery pack system 300 of FIG. 3, each with a potentially large number of battery cells. When employed in a computing rack, a cooling airflow 301 is typically provided through the rack to facilitate cooling of the computing components disposed within the rack, including, for instance, the battery pack backup system(s). In one or more embodiments, the battery cells employed in the battery pack are assumed to be rechargeable battery cells, such as rechargeable lithium-ion battery cells, by way of example. Components 320 can include, components associated with the battery pack system to facilitate, for instance, charging and/or discharging of the battery cells, and to provide, for example, backup power to one or more components within the computing rack, as well as to control and monitor components to implement one or more of the battery capacity management aspects disclosed herein.

As noted, the backup battery pack system embodiment of FIG. 3 is presented by way of example only. Rechargeable battery packs are used in a wide variety of products, including in backup or standby applications, standby and/or stand-alone applications, as well as stand-alone applications. In a backup or standby application, the battery pack is generally connected to a power source via a charger, and there is typically no time constraint on managing battery pack capacity, and processing is fully sustainable. Examples include various backup power systems, such as that depicted in FIG. 3 for a data center computing rack. In a standby and/or stand-alone application, the battery pack can be connected at different times to a power source across the charger, such as may be the case with an electric vehicle or an electric forklift, by way of example. At other times, the battery pack is unconnected to the power source, such as when the electric vehicle is in use. In a stand-alone application, the battery pack may not be connected to a charger most of the time, such as in the case of a mobile phone or a laptop computing device.

Figure 4A:
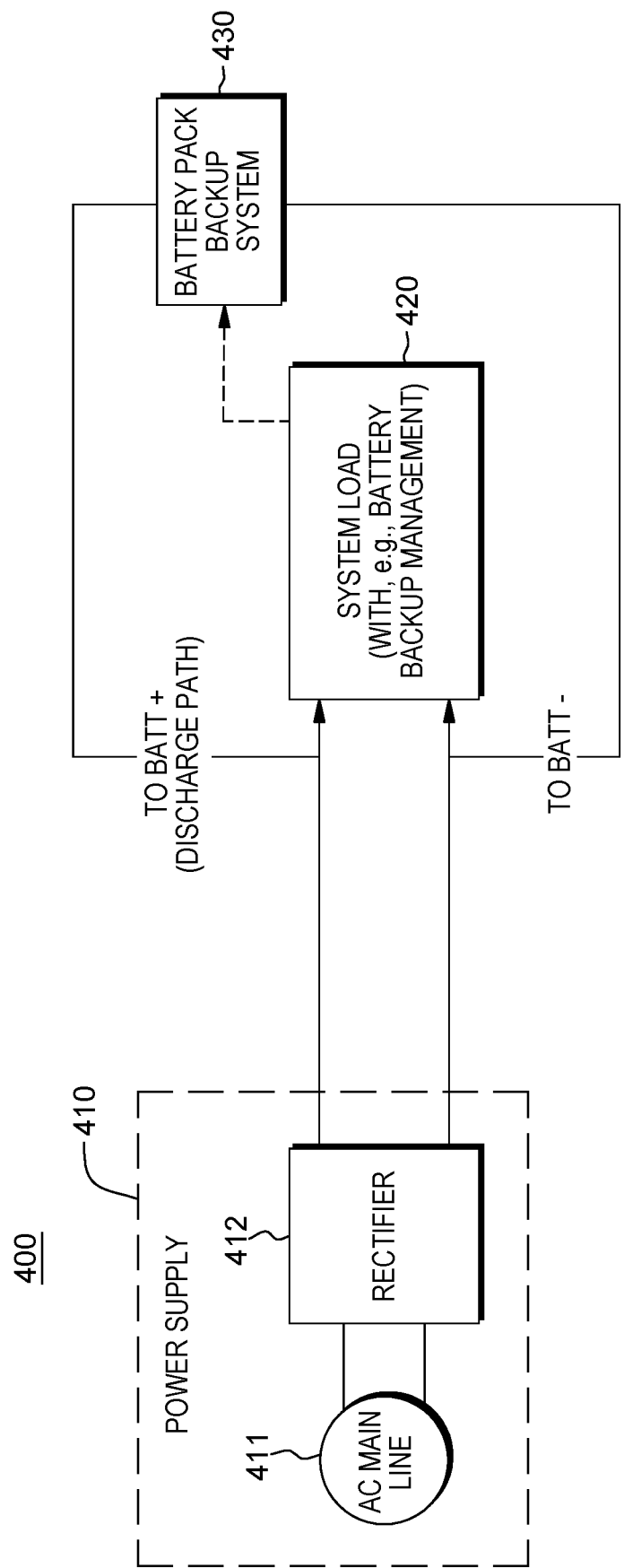
FIG. 4A depicts one embodiment of a power supply system with a battery backup managed for battery capacity optimization, in accordance with one or more aspects of the present invention.
Figure 4C:
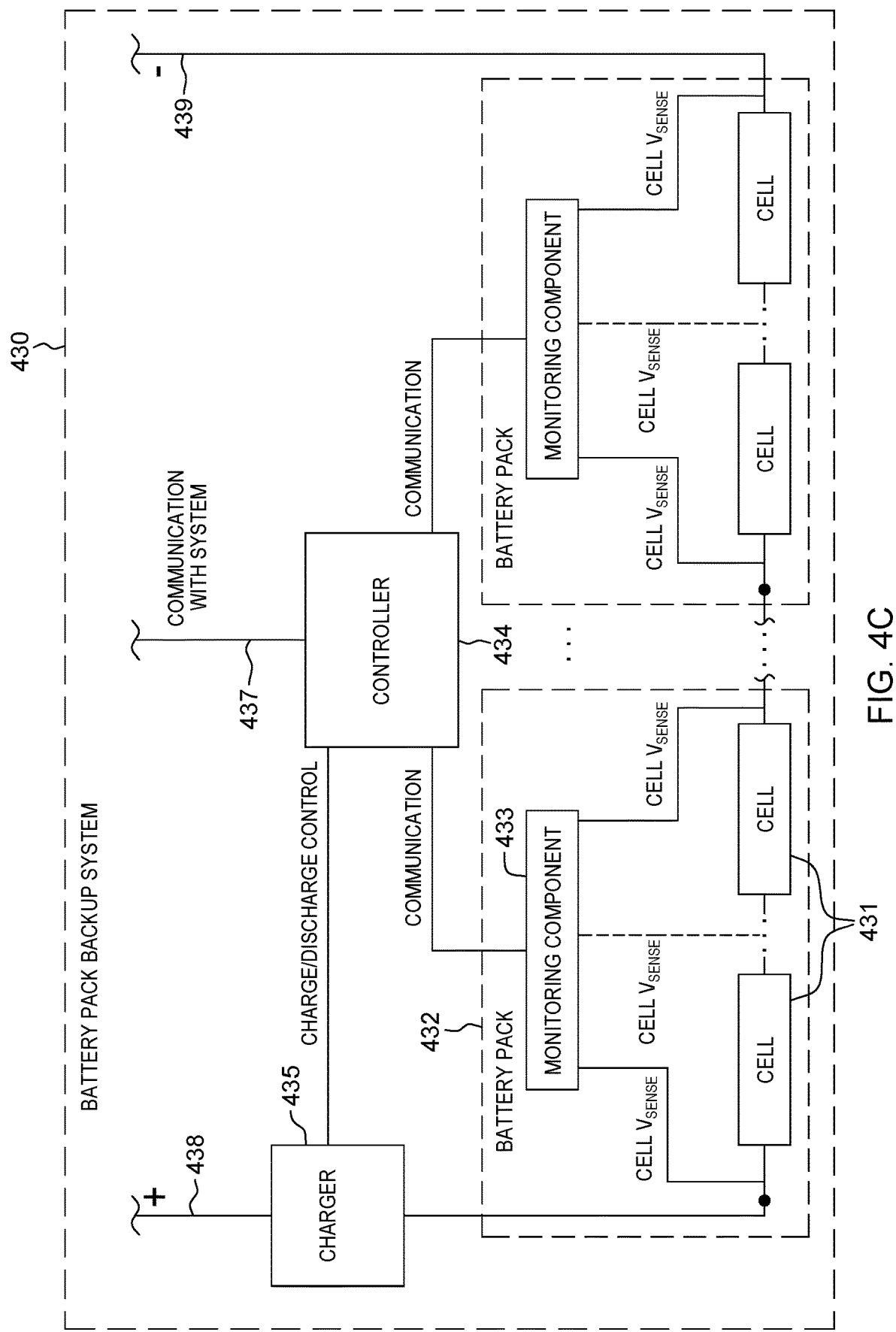
FIG. 4C depicts one embodiment of a battery pack backup system with battery capacity management, in accordance with one or more aspects of the present invention.

By way of further example, FIGS. 4A-4C depict embodiments of power supply systems which supply power to a load, and which incorporate battery backup systems to be managed in accordance with one or more aspects disclosed herein.

By way of example, FIG. 4A is a schematic of one embodiment of a power supply system 400 which includes a power supply or source 410, a load 420, and a battery pack backups or backup pack battery systems 430. By way of example, system 400 can be associated with a computing rack, or a component within a computing rack, with battery pack backup 430 providing power to load 420 should power from power source 410 be interrupted. In the embodiment depicted, and by way of example only, power source 410 receives power from an AC main line 411, which is rectified 412 to provide a desired DC power to load 420. As illustrated in FIG. 4A, battery backup management such as disclosed herein can execute on system load 420. This is a non-limiting example of an implementation. In one or more other implementations, computing resource(s) associated with the battery backup system 430 can execute one or more aspects of battery capacity management, in accordance with one or more aspects of the present invention. Further, a central server or controller within a data center housing the power supply system could implement one or more aspects of the present invention. In other implementations, one or more aspects of battery capacity management such as disclosed herein can execute on cloud-based computing resources.

FIG. 4B depicts another embodiment of a power supply system, where multiple power supplies 410 are coupled in parallel to supply power to system load 420, and where each power supply 410 has associated therewith one or more battery pack backup systems 430. As illustrated, system load 420 can execute, by way of example, one or more aspects of battery backup management such as disclosed herein. In the embodiment of FIG. 4B, system load 420 receives power from power supplies 410 and/or battery pack backup systems 430, and is operatively coupled to power supplies 410 and battery pack backup systems 430 to implement processing such as disclosed herein. In one or more embodiments, the computing system or components implementing battery system capacity management have visibility to the state-of-charge of all battery packs in the battery system(s), and the ability to alter the timing for the top-off charging of the battery packs, as well as the timing for the discharge testing of each battery pack. Note again that the battery pack system is discussed in detail herein as a battery backup, which is one example only. The battery pack capacity optimization described herein is applicable to any of a wide variety of battery packs for a wide variety of uses, such as for standby applications, intermittent standby and standalone applications, as well as mostly standalone applications.

FIG. 4C depicts, by way of example, one embodiment of a battery pack backup system 430 which can be used, for instance, in power supply systems, such as depicted in FIGS. 4A & 4B. In the embodiment of FIG. 4C, battery pack backup system 430 is shown to include, for instance, a plurality of battery packs 432, each including a plurality of battery cells 431, which are also collectively referred to as a cell stack. Those skilled in the art will appreciate that this is one example only of battery pack backup system 430. Within battery pack 432 a monitoring component 433 is provided to monitor cell voltage of the battery pack, such as at the input and output of the battery pack or cell stack, as well as optionally, to measure cell voltage of each individual cell 431, as illustrated in FIG. 4C. Where the battery cells are lithium-ion battery cells, the monitoring components 433 can be multi-cell, lithium-ion battery managers, such as an ISL94212 multi-cell, lithium-ion battery manager, available from Renesas Electronics Corporation, of Tokyo, Japan. The monitoring components 433 are operatively coupled to a controller 434, which in one embodiment, implements or facilitates one or more aspects disclosed herein. As shown, controller 434 is coupled to a charger 435 for charge/discharge control, in accordance with aspects of the present invention. Additionally, controller 434 can be in communication with one or more other computing systems 437, such as one or more computing resources implementing one or more aspects of battery system capacity management processing, such as disclosed herein. Power input 438 and power output 439 lines are also provided coupling battery pack backup system 430 to an actual load, such as system load 420 of the power supply systems of FIGS. 4A & 4B.

In operation, sensed voltage is obtained by monitoring components 433 and provided to controller 434, which monitors the voltage of the individual battery packs. In one or more embodiments, controller 434 implements, or facilitates implementing, staggered top-off charging and discharge testing of the battery packs within the battery pack backup system. Further, in one or more embodiments, discharge testing can be performed by discharging backup power across the actual load. Discharging of power across the actual load is advantageous in that it removes the need for additional circuitry or components inside the battery pack to dissipate the power. The timing and amount of discharge is selected to verify and optimize the state of health of the individual battery cells within the battery pack.

Figure 5A:
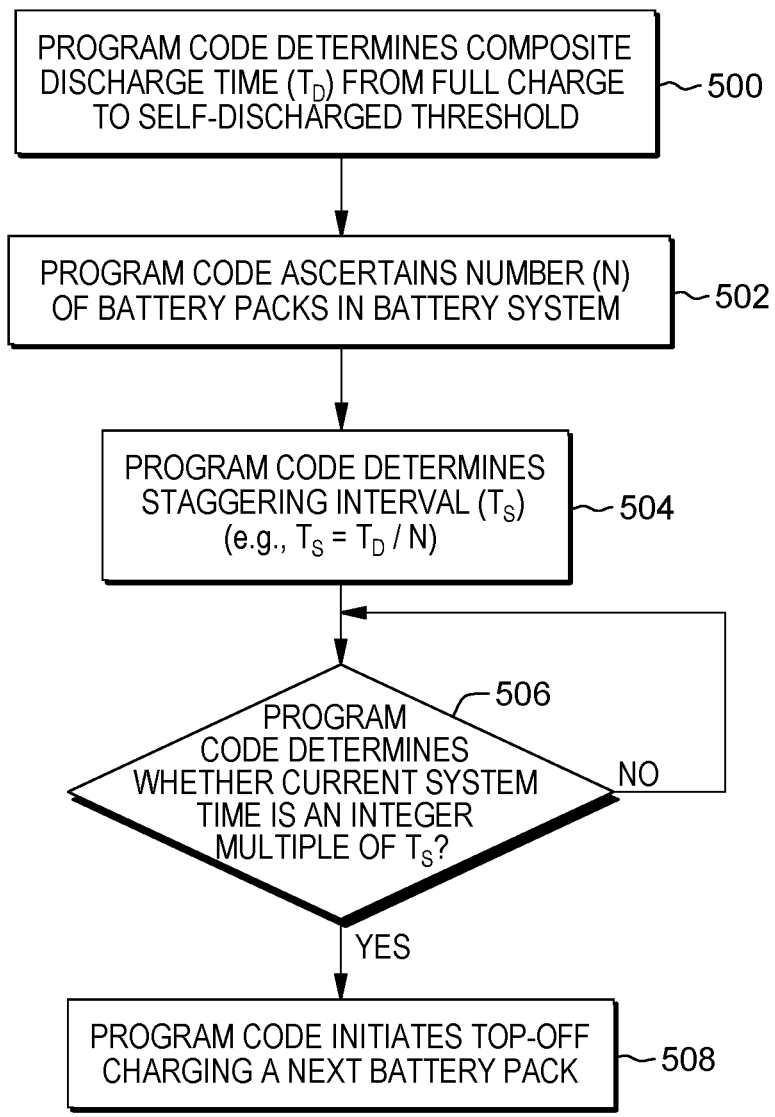
FIG. 5A depicts one embodiment of a workflow illustrating certain aspects of an embodiment of the present invention.
Figure 5B:
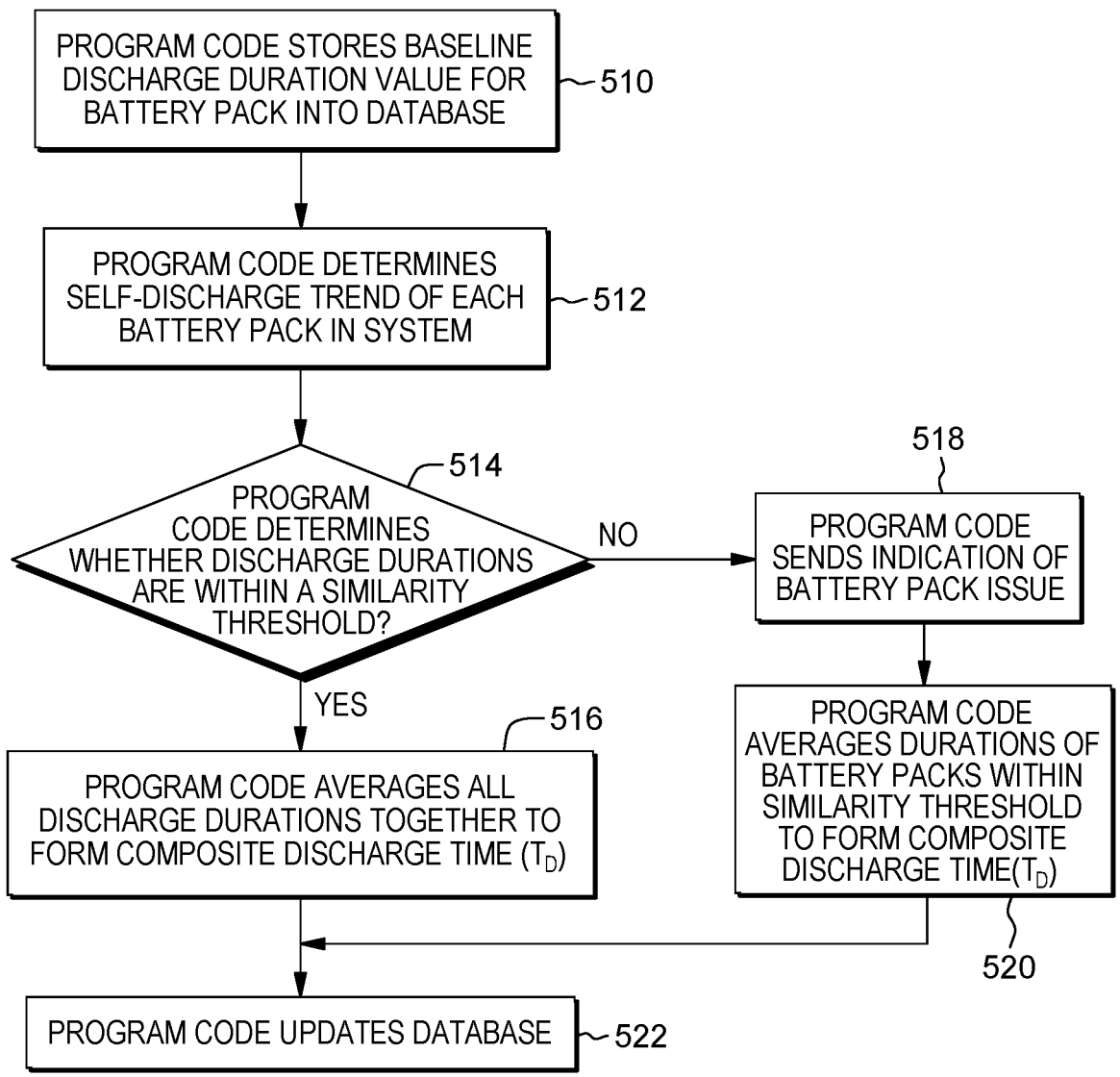
FIG. 5B depicts a further workflow illustrating certain aspects of an embodiment of the present invention.
Figure 5C:
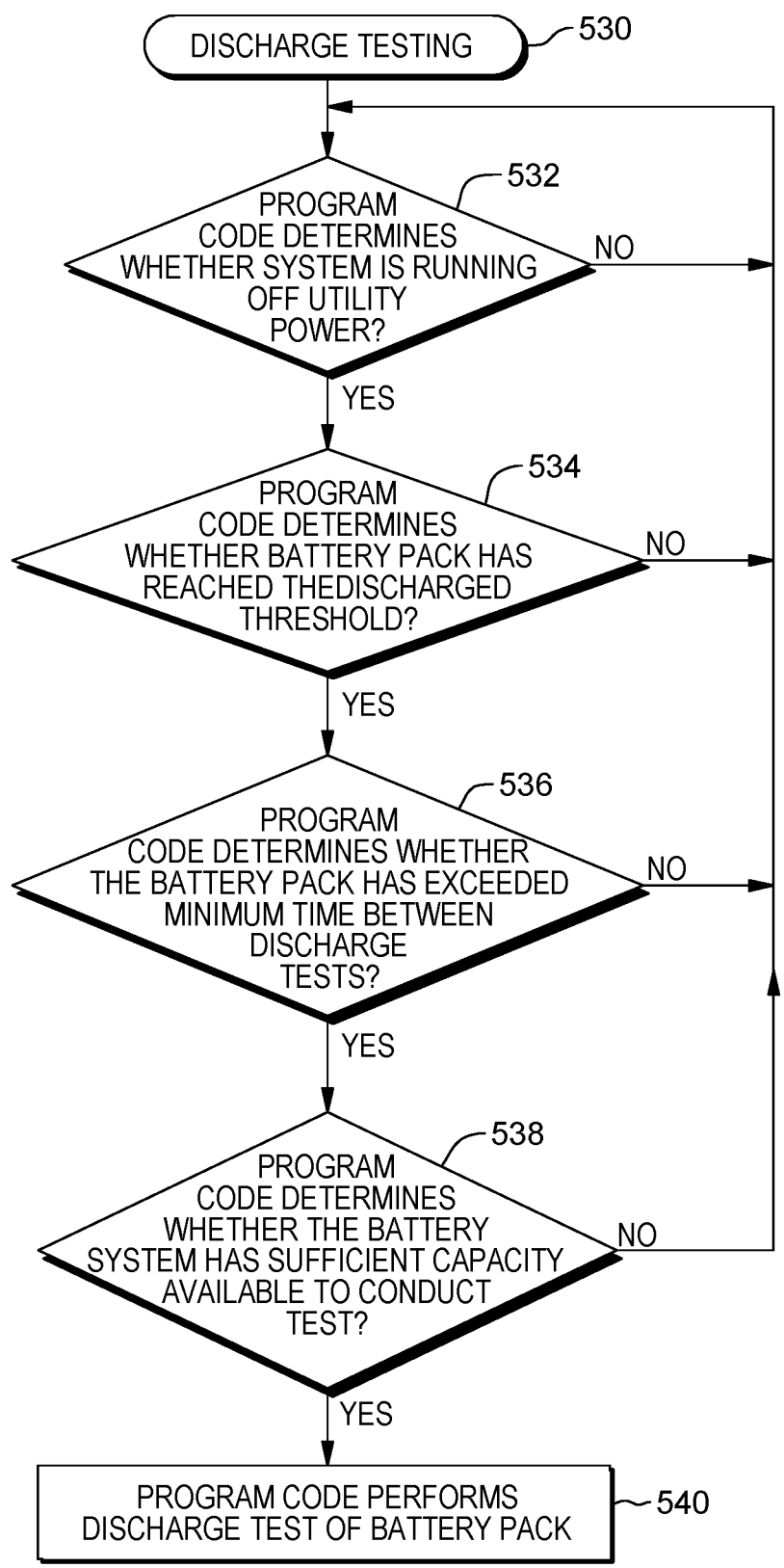
FIG. 5C depicts another workflow illustrating certain aspects of an embodiment of the present invention.

By way of further example, FIGS. 5A-5C depict one or more embodiments of sample workflow processing, in accordance with one or more aspects of the present invention.

As illustrated in FIG. 5A, program code executing one or more processors determines a composite discharge time ($T_D$) from full-charge to a partially discharged threshold 500. In one or more embodiments, the partially discharged threshold is a self-discharged threshold that is predefined for the battery system. For instance, in one or more embodiments, the threshold can be a set percentage of a full state-of-charge.

FIG. 5B depicts one embodiment of a process for determining a composite discharge time ($T_D$) from full-charge to the partially discharged threshold. As illustrated in FIG. 5B, in one or more embodiments, program code stores a baseline discharge duration value into a database for the battery packs of the battery system at issue 510. Note that storing a baseline value for the battery packs is one implementation only of processing for determining a composite discharge duration. By way of example, the baseline value can be obtained from data produced by testing a collection of battery packs of the identical type as the battery packs used in the battery system being managed. The baseline discharge duration value can be obtained or specified at the production level, with the data being stored into a database for use by processing, such as disclosed herein. Program code executing on the one or more processors determines a self-discharge trend of each battery pack in the battery system 512. For instance, the individual self-discharge durations can be measured or monitored via the individual battery pack systems (such as described above), to obtain discharge durations for each battery pack or battery pack system being managed.

Program code executing on one or more processors further determines whether the discharge durations of the battery packs in the battery backup system are within a similarity threshold 514. This processing is to periodically compare the self-discharge durations or rates to determine whether the battery packs are discharging at similar rates, or not. In one or more implementations, the similarity threshold can be that the self-discharge durations are within a set percentage of each other, such as the discharge durations are within 5%-10% of each other. Assuming that the self-discharge durations are all with the similarity threshold, then program code executing on one or more processors averages together the self-discharge durations of the battery packs in the battery backup system(s) to form the composite discharge time ($T_D$) 516. Based on one or more of the self-discharge durations not being within the similarity threshold to other self-discharge durations of the battery packs in the battery system, program code executing on one or more processors sends an indication of a battery pack issue 518, identifying, for instance, the particular battery pack with the rate of discharge out of line with the rates of discharge of other battery packs in the battery system. In this case, program code executing on one or more processors averages together the self-discharge durations of the battery packs within the similarity threshold to form a composite discharge time ($T_D$) 520. Once the composite discharge time is obtained, program code executing on one or more processors updates the database with the obtained composite discharge time, which can also then be used in the process flow of FIG. 5A.

Continuing with FIG. 5A, program code executing on one or more processors further ascertains the number (N) of battery packs in the battery system being managed 502. In particular, data representative of the number of battery packs in the battery system is obtained by the program code. The number of battery packs in the battery system will vary, for instance, according to the configuration of the associated system with which the battery system is used. Program code executing on one or more processors determines a charge-staggering interval ($T_S$) 504. For instance, in one or more embodiments, the charge-staggering interval ($T_S$) can be obtained from the composite discharge time ($T_D$) divided by the number (N) of battery packs in the battery system.

Figure 6:
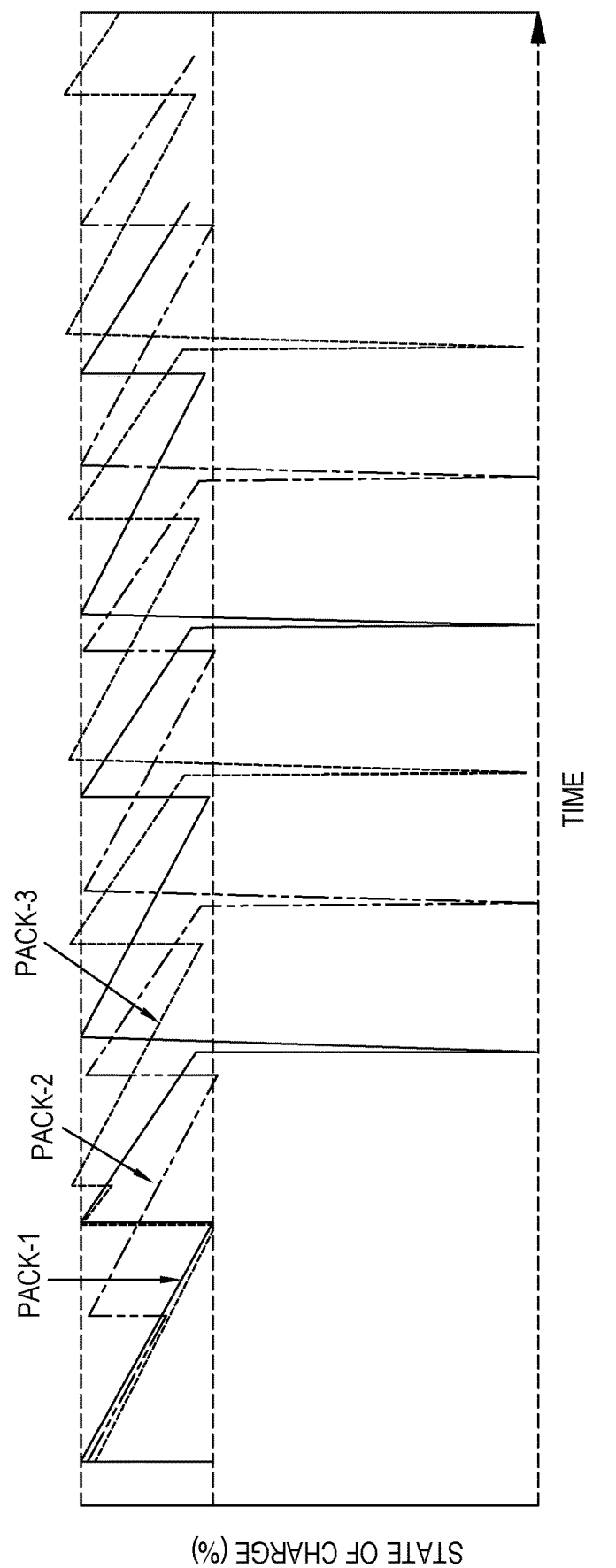
FIG. 6 graphically illustrates one embodiment of battery capacity over time of multiple battery packs of a battery system managed for battery capacity optimization, in accordance with one or more aspects of the present invention.

In the embodiment illustrated, program code executing on one or more processors determines whether the current operational time of the battery system is an integer multiple of the charge-staggering time interval ($T_S$) 506. If "no", then processing waits until the current operational time of the battery system is an integer multiple of the charge-staggering time interval ($T_S$), and once the charge-staggering time interval has again passed, program code initiates top-off charging of a next battery pack in the battery system 508. The result is a staggering of top-off charging of the battery packs in the battery system, such as illustrated in FIG. 6, which depicts staggered top-off charging in a battery system having three battery packs (pack-1, pack-2, and pack-3). In one or more implementations, the staggered top-off chargings are spaced equidistance in time from each other. This advantageously prevents a situation where there is insufficient capacity available to support (for instance, as a backup) the system load. Further, this optimizes system battery capacity by resulting in a more homogeneous total battery capacity curve.

FIG. 5C depicts one embodiment a discharge testing workflow facilitating battery capacity optimization, such as disclosed herein. As illustrated, in one or more embodiments, discharge testing 530 includes program code executing on one or more processors determining whether the system load is running off utility power 532. If "no", that is, if the battery power is currently being used to power the system load, then discharge testing is delayed, and no action is taken. Assuming that the system load is currently running off utility power, then program code executing on one or more processors determines whether a next battery pack is near or has reached the partially discharged threshold 534. Once a battery pack is near or has reached the partially discharged threshold, then, in one or more embodiments, program code executing on one or more processors determines whether that battery pack is at or has exceeded the minimum time required between discharge tests 536. Assuming that the battery pack is at or has exceeded the minimum time requirement between discharge tests, then program code executing on one or more processors determines whether the battery system has sufficient capacity available to conduct a test 538 before proceeding. Assuming that the battery system has sufficient capacity available to conduct the test, then program code executing on one or more processors performs a discharge test of the subject battery pack 540.

As discussed herein, one or more aspects of the present invention are directed to optimizing available battery capacity within a battery system utilizing a staggered top-off charging approach. The batteries of the battery system are assumed to be rechargeable batteries which self-discharge over time, and are to be periodically recharged to a full-charge state. In one or more aspects, a composite self-discharge time interval ($T_D$) is determined from full-charge to self-discharge of battery packs of the battery system. As noted, in the example above, this can include obtaining a baseline value from production testing, measuring the self-discharge trends of each battery pack in the battery system, and comparing the self-discharge trends or rates to determine whether one or more packs have significantly different discharge rates than the remaining packs. Assuming that the discharge rates are within a similarity threshold, then the discharge durations are averaged together to ascertain a composite self-discharge time interval ($T_D$), which is then saved in a database for use as described herein. In one or more implementations, the method includes identifying a number of battery packs in the system, and determining a charge-staggering time interval ($T_S$) using the number (N) of battery packs in the battery system and the ascertained battery pack self-discharge time interval ($T_D$). In one or more aspects, the battery packs are then top-off charged in a staggered manner using, at least in part, the charge-staggering time interval ($T_S$). For instance, responsive to determining that a current operational time of the battery system is an integer multiple of the charge-staggering time interval ($T_S$), then a next battery pack in the battery system undergoes top-off charging. Further, disclosed herein, in one or more aspects, is processing for determining when to conduct a discharge test of a battery pack (along with when to top-off charge), based on the capacity status of the overall system, and the characteristics of the individual battery packs within the battery system.

One example of a computer system, that includes one or more processors that can be used to implement one or more aspects of the present invention, is described below with reference to FIG. 7. In this example, the computer system is part of a computing environment including additional components that may or may not be used by aspects of the present invention.

As shown in FIG. 7, a computing environment 10 includes, for instance, a computer system 12 shown, e.g., in the form of a general-purpose computing device. Computer system 12 may include, but is not limited to, one or more processors or processing units 14 (e.g., central processing units (CPUs)), a memory 16 (a.k.a., system memory, main memory, main storage, central storage or storage, as examples), and one or more input/output (I/O) interfaces 18, coupled to one another via one or more buses and/or other connections 20.

Bus 20 represents one or more of any of several types of bus structures, including a memory bus or memory controller, a peripheral bus, an accelerated graphics port, and a processor or local bus using any of a variety of bus architectures. By way of example, and not limitation, such architectures include the Industry Standard Architecture (ISA), the Micro Channel Architecture (MCA), the Enhanced ISA (EISA), the Video Electronics Standards Association (VESA) local bus, and the Peripheral Component Interconnect (PCI).

Memory 16 can include, for instance, a cache 22, such as a shared cache, which can be coupled to local caches 23 of processors 14. Further, memory 16 can include one or more programs or applications 24, an operating system 26, and one or more computer readable program instructions 28. In one or more embodiments, computer readable program instructions 28 can be configured to carry out functions of embodiments of aspects of the invention.

Computer system 12 can also communicate via, e.g., I/O interfaces 18 with one or more external devices 30, one or more network interfaces 32, and/or one or more data storage devices 34. Example external devices include a user terminal, a tape drive, a pointing device, a display, etc. Network interface 32 enables computer system 12 to communicate with one or more networks, such as a local area network (LAN), a general wide area network (WAN), and/or a public network (e.g., the Internet), providing communication with other computing devices or systems.

Data storage device 34 can store one or more programs 36, one or more computer readable program instructions 38, and/or data, etc. In one or more embodiments, the computer readable program instructions can be configured to carry out functions of embodiments of aspects of the invention.

Computer system 12 can include and/or be coupled to removable/non-removable, volatile/non-volatile computer system storage media. For example, it can include and/or be coupled to a non-removable, non-volatile magnetic media (typically called a "hard drive"), a magnetic disk drive for reading from and writing to a removable, non-volatile magnetic disk (e.g., a "floppy disk"), and/or an optical disk drive for reading from or writing to a removable, non-volatile optical disk, such as a CD-ROM, DVD-ROM or other optical media. It should be understood that other hardware and/or software components could be used in conjunction with computer system 12. Examples, include, but are not limited to: microcode, device drivers, redundant processing units, external disk drive arrays, RAID systems, tape drives, and data archival storage systems, etc.

Computer system 12 can be operational with numerous other general purpose or special purpose computing system environments or configurations. Examples of well-known computing systems, environments, and/or configurations that are suitable for use with computer system 12 include, but are not limited to, personal computer (PC) systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

In one example, a processor, such as processor 14, can execute one or more components to perform one or more aspects of the present invention. These components can be stored in memory, including main memory (e.g., memory 16) and/or one or more caches (e.g., shared cache 22, local cache 23) and/or external storage (e.g., device 34), and can be executed by one or more processors (e.g., processor 14).

In one example, the components can include an obtaining engine used in obtaining data representative of the number (N) of battery packs in the battery system; an ascertaining engine used in ascertaining a battery pack self-discharge time interval ($T_D$) from full-charge to a partially discharged threshold for initiating top-off charging; a determining engine used in determining a charge-staggering time interval ($T_S$); and a staggering engine used in staggering top-off charging of the battery packs of the N battery packs in the battery system using, at least in part, charge-staggering time interval ($T_S$). The components executed by a processor can be individual components or combined in one component. Further, other components may be included to perform one or more other tasks. Many variations are possible.

One or more aspects may relate to cloud computing.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based email). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

A cloud computing node can include a computer system/server such as the one depicted in FIG. 7. Computer system/server 12 of FIG. 7 can be practiced and distributed in cloud computing environments where tasks are performed by remote processing devices that are linked through a communications network. In a distributed cloud computing environment, program modules can be located in both local and remote computer system storage media, including memory storage devices. Computer system/server 712 is capable of being implemented and/or performing any of the functionality set forth hereinabove.

Figure 8:
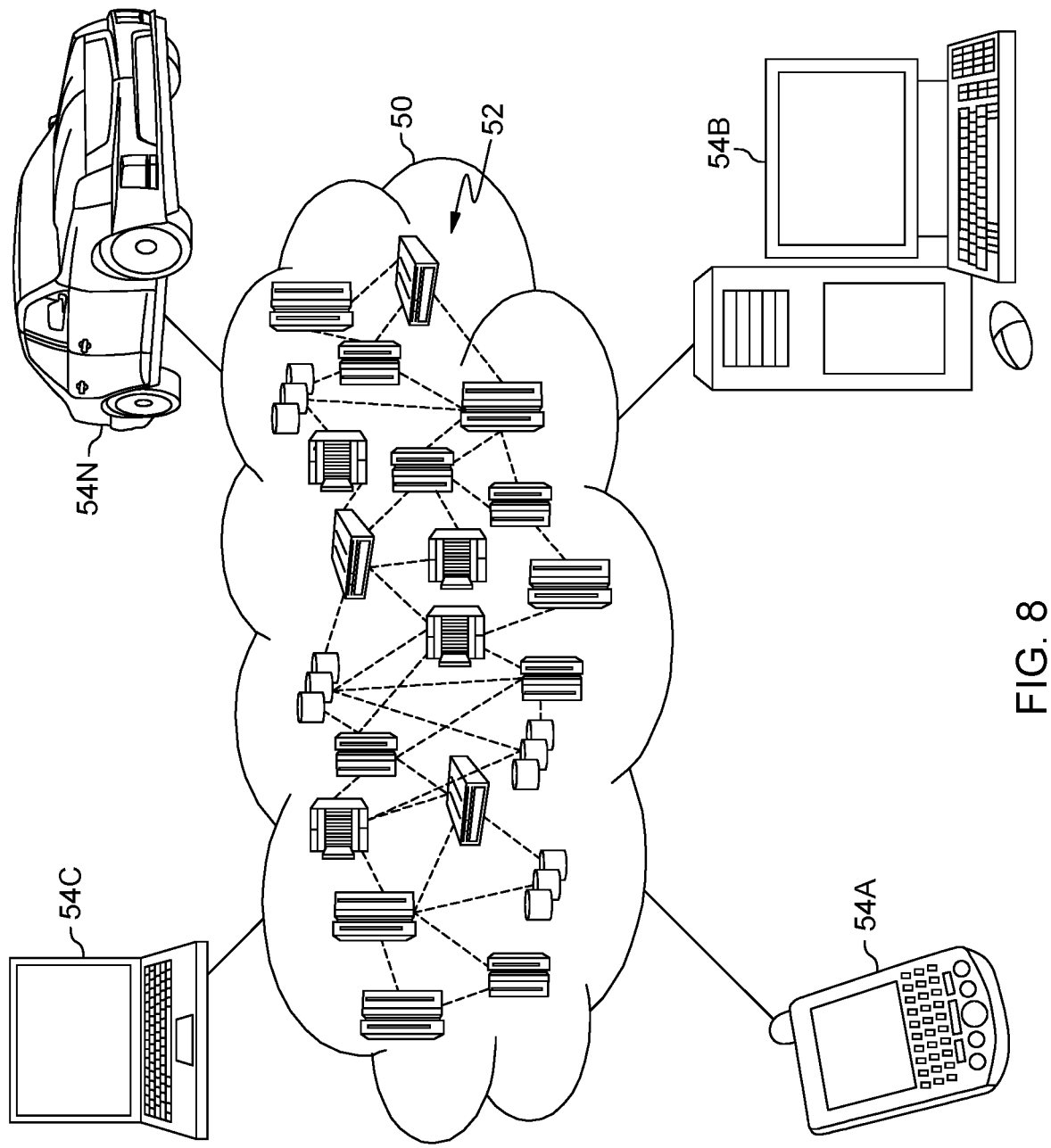
FIG. 8 depicts one embodiment of a cloud computing environment which can facilitate implementing, or be used in association with, certain aspects of an embodiment of the present invention.

Referring now to FIG. 8, illustrative cloud computing environment 50 is depicted. As shown, cloud computing environment 50 comprises one or more cloud computing nodes 52 with which local computing devices used by cloud consumers, such as, for example, personal digital assistant (PDA) or cellular telephone 54A, desktop computer 54B, laptop computer 54C, and/or automobile computer system 54N may communicate. Nodes 52 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 8 are intended to be illustrative only and that computing nodes 52 and cloud computing environment 50 can communicate with any type of computerized device over any type of network and/or network addressable connection (e.g., using a web browser).

Figure 9:
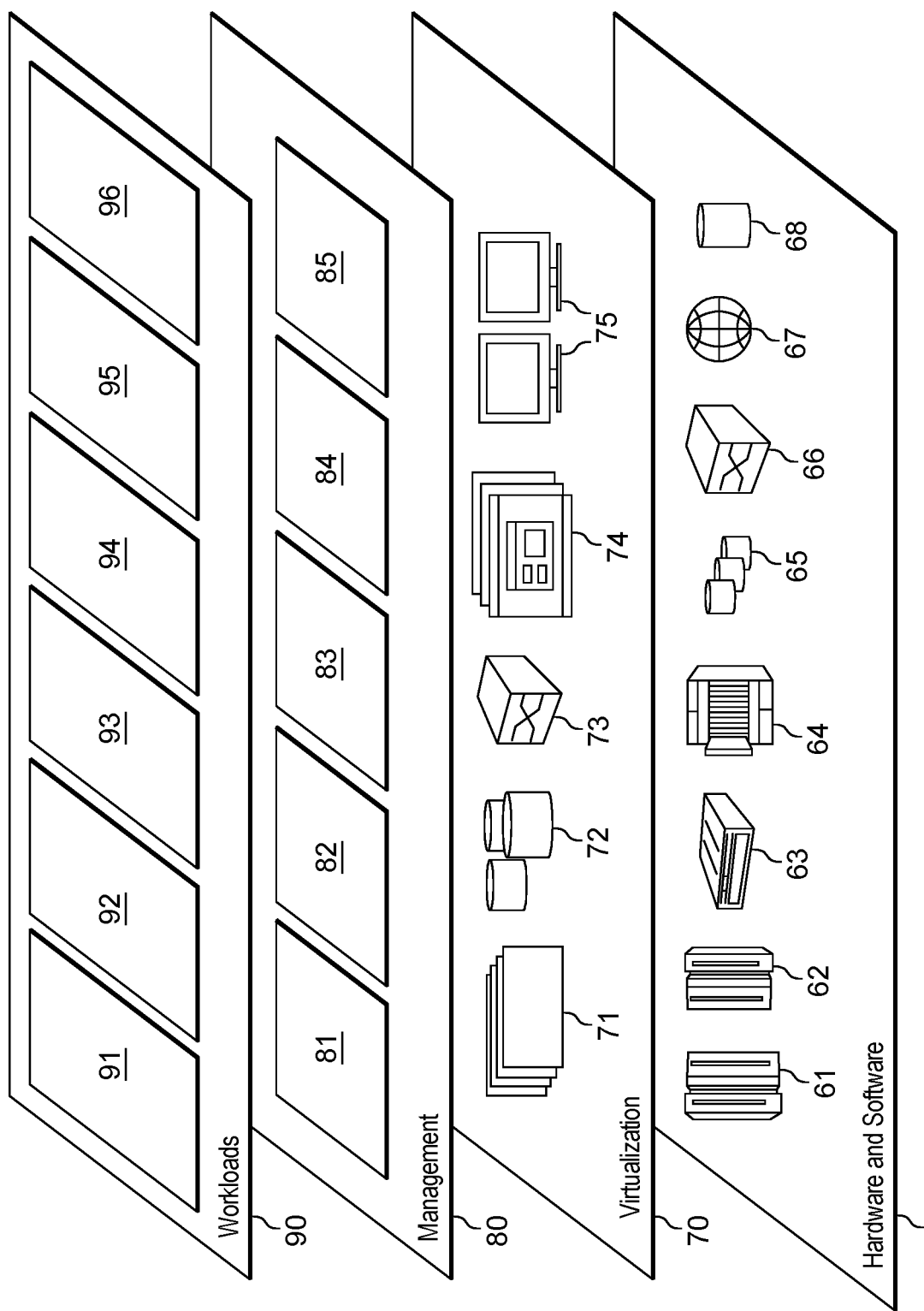
FIG. 9 depicts abstraction model layers according to an embodiment of the present invention.

Referring now to FIG. 9, a set of functional abstraction layers provided by cloud computing environment 50 (FIG. 8) is shown. It should be understood in advance that the components, layers, and functions shown in FIG. 9 are intended to be illustrative only and embodiments of the invention are not limited thereto. As depicted, the following layers and corresponding functions are provided.

Hardware and software layer 60 includes hardware and software components. Examples of hardware components include mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and battery capacity optimization processing 96, which includes, for instance, managing top-off charging and discharge testing of battery packs in a battery system, such as described herein.

Aspects of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It is noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer readable code into a computing system, in which the code in combination with the computing system is capable of performing one or more embodiments.

As yet a further aspect, a process for integrating computing infrastructure comprising integrating computer readable code into a computer system may be provided. The computer system comprises a computer readable medium, in which the computer medium comprises one or more embodiments. The code in combination with the computer system is capable of performing one or more embodiments.

Although various embodiments are described above, these are only examples. For example, other types of devices and/or tracking components may be used in one or more embodiments. Many variations are possible.

Further, other types of computing environments can benefit and be used. As an example, a data processing system suitable for storing and/or executing program code is usable that includes at least two processors coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A computer-implemented method of managing battery capacity within a battery system, the computer-implemented method comprising:
    obtaining, by one or more processors, data representative of a number (N) of battery packs in the battery system;
    ascertaining, by the one or more processors, a battery pack self-discharge time interval ($T_D$) from full-charge to a partially discharged threshold for initiating top-off charging;
    determining, by the one or more processors, a charge-staggering time interval ($T_S$), the determining using the number (N) of battery packs in the battery system and the ascertained battery pack self-discharge time interval ($T_D$); and
    staggering, by the one or more processors, top-off charging of the battery packs of the N battery packs in the battery system using, at least in part, the charge-staggering time interval ($T_S$).

2. The computer-implemented method of claim 1, wherein the battery pack self-discharge time interval ($T_D$) is a composite self-discharge time interval for the battery packs of the N battery packs in the battery system.

3. The computer-implemented method of claim 2, wherein ascertaining the battery pack self-discharge time interval ($T_D$) from full-charge to the partially discharged threshold comprises:
    ascertaining, by the one or more processors, a self-discharge duration for each battery pack of the N battery packs in the battery system from full-charge to the partially discharged threshold for initiating top-off charging;
    determining, by the one or more processors, for each battery pack of the N battery packs, whether the self-discharge duration of that battery pack is within a similarity threshold of the self-discharge durations of other battery packs of the N battery packs; and
    based on determining that the self-discharge durations for the N battery packs are within the similarity threshold, averaging, by the one or more processors, the self-discharge durations of the N battery packs together to obtain the composite self-discharge time interval for the N battery packs in the battery system.

4. The computer-implemented method of claim 3, further comprising:
    based on determining, by the one or more processors, that a self-discharge duration of a battery pack of the N battery packs is outside the similarity threshold from the self-discharge durations of other battery packs of the N battery packs, averaging only the self-discharge durations within the similarity threshold together to obtain the composite self-discharge time interval.

5. The computer-implemented method of claim 4, further comprising sending, by the one or more processors, a signal indicating an issue with the battery pack having the self-discharge duration outside the similarity threshold from the self-discharge durations of the other battery packs of the N battery packs.

6. The computer-implemented method of claim 2, wherein determining, by the one or more processors, the charge-staggering time interval ($T_S$) comprises dividing data representative of the composite self-discharge time interval ($T_D$) by the number N to obtain the charge-staggering time interval ($T_S$).

7. The computer-implemented method of claim 6, wherein the staggering, by the one or more processors, top-off charging of the N battery packs comprises determining whether a current operational time of the battery system is an integer multiple of the charge-staggering time interval ($T_S$), and based on the current operational time being an integer multiple of the charge-staggering time interval ($T_S$), top-off charging a next battery pack of the N battery packs in the battery system.

8. The computer-implemented method of claim 1, further comprising:
staggering, by the one or more processors, discharge testing of the N battery packs so that only one battery pack of the N battery packs undergoes discharge testing at a time.

9. The computer-implemented method of claim 8, wherein staggering, by the one or more processors, discharge testing comprises:
determining, by the one or more processors, whether a battery pack of the N battery packs has reached the partially discharged threshold for initiating top-off charging;
determining, by the one or more processors, whether the battery pack has exceeded a minimum required time interval between discharge testing; and
based on the battery pack having reached the partially discharged threshold, and based on the battery pack being at or exceeding the minimum required time interval between discharge testing, proceeding, by the one or more processors, with discharge testing of the battery pack.

10. The computer-implemented method of claim 1, wherein staggering, by the one or more processors, top-off charging comprises spacing equidistant in time top-off charging of battery packs of the N battery packs in the battery system.

11. A system for managing battery capacity within a battery system, the system comprising:
a memory; and
one or more processors communicatively coupled to the memory, wherein the system performs a method comprising:
obtaining, by the one or more processors, data representative of a number (N) of battery packs in the battery system;
ascertaining, by the one or more processors, a battery pack self-discharge time interval ($T_D$) from full-charge to a partially discharged threshold for initiating top-off charging;
determining, by the one or more processors, a charge-staggering time interval ($T_S$), the determining using the number (N) of battery packs in the battery system and the ascertained battery pack self-discharge time interval ($T_D$); and
staggering, by the one or more processors, top-off charging of the battery packs of the N battery packs in the battery system using, at least in part, the charge-staggering time interval ($T_S$).

12. The computer system of claim 11, wherein the battery pack self-discharge time interval ($T_D$) is a composite self-discharge time interval for the battery packs of the N battery packs in the battery system.

13. The computer system of claim 12, wherein ascertaining the battery pack self-discharge time interval ($T_D$) from full-charge to the partially discharged threshold comprises:
ascertaining, by the one or more processors, a self-discharge duration for each battery pack of the N battery packs in the battery system from full-charge to the partially discharged threshold for initiating top-off charging;
determining, by the one or more processors, for each battery pack of the N battery packs, whether the self-discharge duration of that battery pack is within a similarity threshold of the self-discharge durations of other battery packs of the N battery packs; and
based on determining that the self-discharge durations for the N battery packs are within the similarity threshold, averaging, by the one or more processors, the self-discharge durations of the N battery packs together to obtain the composite self-discharge time interval for the N battery packs in the battery system.

14. The computer system of claim 13, further comprising:
based on determining, by the one or more processors, that a self-discharge duration of a battery pack of the N battery packs is outside the similarity threshold from the self-discharge durations of other battery packs of the N battery packs, averaging only the self-discharge durations within the similarity threshold together to obtain the composite self-discharge time interval.

15. The computer system of claim 12, wherein determining, by the one or more processors, the charge-staggering time interval ($T_S$) comprises dividing data representative of the composite self-discharge time interval ($T_D$) by the number N to obtain the charge-staggering time interval ($T_S$).

16. The computer system of claim 15, wherein the staggering, by the one or more processors, top-off charging of the N battery packs comprises determining whether a current operational time of the battery system is an integer multiple of the charge-staggering time interval ($T_S$), and based on the current operational time being an integer multiple of the charge-staggering time interval ($T_S$), top-off charging a next battery pack of the N battery packs in the battery system.

17. The computer system of claim 11, further comprising:
staggering, by the one or more processors, discharge testing of the N battery packs so that only one battery pack of the N battery packs undergoes discharge testing at a time.

18. The computer system of claim 17, wherein staggering, by the one or more processors, discharge testing comprises:
determining, by the one or more processors, whether a battery pack of the N battery packs has reached the partially discharged threshold for initiating top-off charging;
determining, by the one or more processors, whether the battery pack has exceeded a minimum required time interval between discharge testing; and
based on the battery pack having reached the partially discharged threshold, and based on the battery pack being at or exceeding the minimum required time interval between discharge testing, proceeding, by the one or more processors, with discharge testing of the battery pack.

19. A computer program product for managing battery capacity within a battery system, the computer program product comprising:
a computer-readable storage medium having program instructions embodied therewith, the program instructions being executable by one or more processors to cause the one or more processors to:
obtain, by the one or more processors, data representative of a number (N) of battery packs in the battery system;
ascertain, by the one or more processors, a battery pack self-discharge time interval ($T_D$) from full-charge to a partially discharged threshold for initiating top-off charging;

determine, by the one or more processors, a charge-staggering time interval ($T_S$), the determining using the number (N) of battery packs in the battery system and the ascertained battery pack self-discharge time interval ($T_D$); and stagger, by the one or more processors, top-off charging of the battery packs of the N battery packs in the battery system using, at least in part, the charge-staggering time interval ($T_S$).

20. The computer program product of claim 19, wherein the battery pack self-discharge time interval ($T_D$) is a composite self-discharge time interval for the battery packs of the N battery packs in the battery system, and staggering, by the one or more processors, top-off charging comprises spacing equidistant in time top-off charging of battery packs of the N battery packs in the battery system.

\* \* \* \* \*